United States Patent [19]
Kosugi

[11] 4,271,577
[45] Jun. 9, 1981

[54] ALIGNMENT DEVICE

[75] Inventor: Masao Kosugi, Yokohama, Japan

[73] Assignee: Canon Kabushiki Kaisha, Tokyo, Japan

[21] Appl. No.: 32,735

[22] Filed: Apr. 24, 1979

[30] Foreign Application Priority Data

Apr. 28, 1978 [JP] Japan .................................. 53/51849

[51] Int. Cl.³ ............................................ B23P 19/04
[52] U.S. Cl. .................................................... 29/238
[58] Field of Search ..................... 29/238, 281.1, 281.2, 29/281.4, 28.5, 743

[56] References Cited
U.S. PATENT DOCUMENTS 2,094,043  9/1937  Marshall ............................ 29/238 X
2,591,015  4/1952  Schoemann ....................... 29/238 X Primary Examiner—Harold D. Whitehead
Attorney, Agent, or Firm—Fitzpatrick, Cella, Harper & Scinto

[57] ABSTRACT

An alignment device for bringing a mask and a wafer into intimate contact with each other for the manufacture of a semiconductor circuit element. In this device, an air-tight chamber is formed between the mask and the wafer. The mask and the wafer are brought into intimate contact with each other by evacuating the airtight chamber. In this case, the mask is made parallel to the wafer or warped toward the wafer. Thus, no non-contact portion is created between the central portions of the mask and the wafer.

2 Claims, 6 Drawing Figures

FIG. I
PRIOR ART
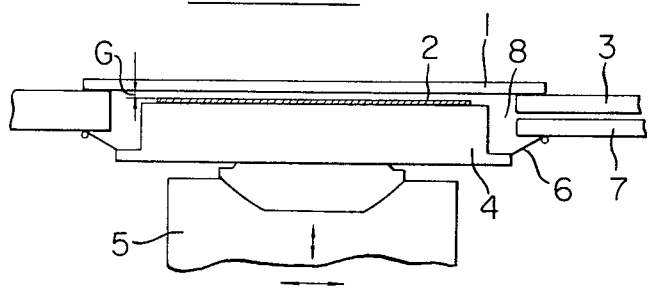
FIG. 2
PRIOR ART
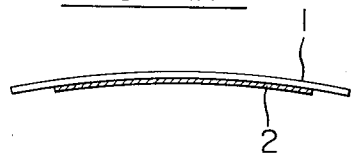
FIG. 3
PRIOR ART
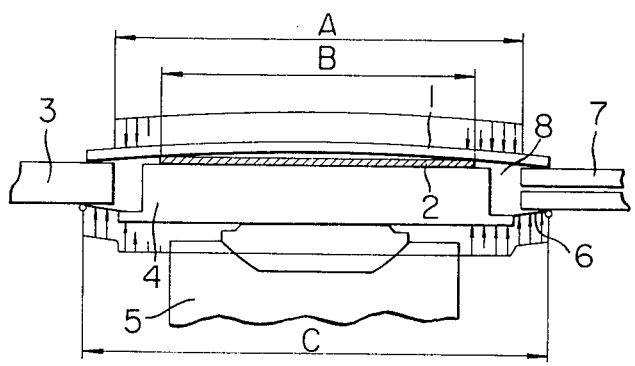

ALIGNMENT DEVICE

BACKGROUND OF THE INVENTION

1. Field of the Invention

This invention relates to an alignment device for the manufacture of semiconductor circuit elements, and more particularly to an alignment device for bringing a mask and a wafer into intimate contact with each other.

2. Description of the Prior Art

Intimate contact between a mask and a wafer has been accomplished usually by rendering air-tight the clearance between a mask supported by a mask supporting member and a wafer supported by a wafer supporting member movable toward the surface of the mask, by evacuating the clearance between the mask and the wafer by means of a vacuum pump, and by moving the wafer supporting member toward the mask with the aid of the differential between the vacuum pressure and the atmospheric pressure or by bringing the photomask and the wafer into intimate contact with each other with the aid of a force created by the pressure differential.

However, this contact method, as will later be fully described by reference to the accompanying drawings, has suffered from a disadvantage that the mask is forced upwardly by the peripheral portion of the wafer and accordingly, the mask is warped toward the surface opposite to the surface of the wafer which is in intimate contact with the mask, namely, the free surface of the wafer, to create a non-contact portion between the central areas of the mask and wafer or to cause warping of both the mask and the wafer, thus preventing the mask pattern from being accurately printed.

SUMMARY OF THE INVENTION

This invention is concerned with an alignment device which eliminates the above-noted disadvantage. Accordingly, it is an object of the present invention to provide an alignment device which enables a mask to be completely in intimate contact with a wafer. This object is achieved by making the mask flat or making the mask warp toward the wafer when the two are brought into intimate contact. More specifically, the object is achieved by determining the sizes of a mask side effective pressure taking area which takes a distributed load corresponding to the differential between the vacuum pressure and the atmospheric pressure and a wafer side effective pressure taking area so that the mask is flat or warped toward the wafer when the mask and wafer are brought into intimate contact with each other.

By adopting such a construction, there is provided an alignment device which eliminates the abovenoted disadvantage peculiar to the prior art and which enables the mask pattern to be accurately recorded on the wafer.

The invention will become more fully apparent from the following detailed description thereof taken in conjunction with the accompanying drawings.

BRIEF DESCRIPTION OF THE DRAWINGS

FIG. 1 shows the time of alignment between a mask and a wafer in the printer according to the prior art.

FIG. 2 shows the upwardly warped state of the mask and the wafer.

FIG. 3 shows the mask and the wafer being in intimate contact in the printer of FIG. 1.

DESCRIPTION OF THE PREFERRED EMBODIMENTS

Figure 4:
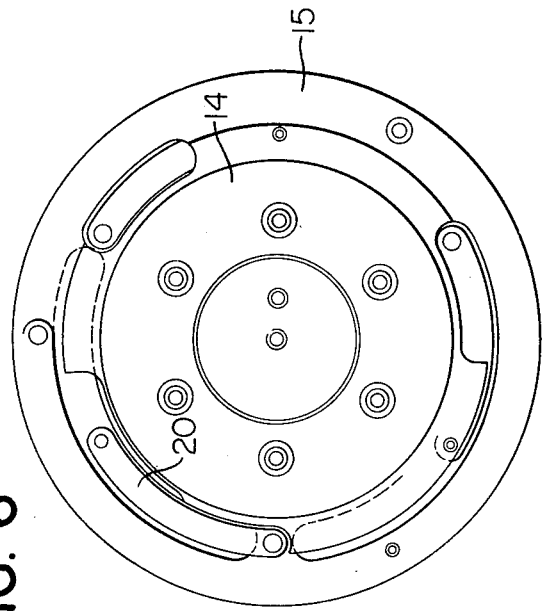
FIG. 4 shows a first embodiment of the present invention.

Reference is first had to FIGS. 1 to 4 to describe the device according to the prior art. FIG. 1 shows the alignment between a mask 1 and wafer 2. The mask 1 is fixed to a fixed mask supporting member 3. Designated by 4 is a wafer supporting member for supporting the wafer. This supporting member 4 is supported on a push-up member 5 forming an (alignment) gap G, by means of spherical bearing. The push-up member 5 is movable in x-, y- and θ-direction to align the mask 1 and the wafer 2. Designated by 6 is seal rubber forming an air-tight chamber for enabling the air vent between the surface of the mask 1 which is to be in intimate contact with the wafer and the top surface of the wafer. Denoted by 7 is an exhaust hole connected to a vacuum pump, not shown.

In the device of FIG. 1, the wafer 2 already has its top surface abutting against a calibrator, not shown, and the non-parallelism of the wafer to the surface of the mask 1 which is in intimate contact with the wafer is completely corrected by the spherical bearing. The (alignment) gap G is formed between the surface of the mask which is in intimate contact with the wafer, which surface is the underside of the mask 1, and the top surface of the wafer. The mask and the wafer are viewed through a microscope, not shown, and the push-up member 5 and the wafer supporting member 4 are moved by an x, y, θ alignment between the mask and the wafer. After the alignment operation of the mask and wafer, air vent is effected through the exhaust hole 7. Since the mask supporting member 3 is fixed, the wafer 2 is elevated with the wafer supporting member 4 and the push-up member 5 and brought into intimate contact with the mask 1. In this case, when the load taken by the underside of the mask 1 through the wafer 2 is great as compared with the load applied on the free surface or top surface of the mask 2, the top surface load is a load distributed over an opening, whereas the underside load is a load concentrated on the wafer contact surface smaller than the opening and therefore, the mask may be upwardly warped to create an air layer between the mask 1 and the wafer 2 or as shown in FIG. 2, the wafer 2 may follow the upwardly warped mask 1. In the former case, the intimate contact between the mask and the wafer is prevented by the air layer and thus, the mask pattern of that portion cannot be accurately printed. In the latter case, pitch error is created in the peripheral portion and the mask pattern of the peripheral portion cannot be accurately printed.

Reference is particularly had to FIG. 3 to explain the reason why the mask 1 is upwardly warped in the device of the prior art. The size of the atmospheric pressure taking portion which imparts a load to the underside of the mask 1 through the wafer 2 is a size which can be expressed by a diameter C, and the size of the atmospheric pressure taking portion which exerts a load on the top surface of the mask is a size which can be expressed by a diameter A. Since it is structurally desired that the seal rubber 6 for forming the air-tight chamber 8 adhere to the underside of the mask supporting member 3, the diameter C is greater than the diameter A.

Also, as already described with respect to FIG. 1, in order that the wafer 2 may be moved for x, y, θ alignment relative to the fixed mask 1, the wafer 2 must be made small relative to the mask 1 so that it can be expressed by a diameter B.

Therefore, the load taken by the underside of the mask 1 is greater than the load exerted on the top surface of the mask 1 made of material, such as glass, which is relatively flexible, i.e., easy to warp. Accordingly, the mask 1 is pushed by the top surface of the wafer 2 and upwardly warped to create the disadvantage as already noted.

FIG. 4 shows an embodiment of the present invention in which such upward warping of the mask is not created.

In FIG. 4, the wafer supporting member 4, for supporting a wafer which is rigid, i.e., difficult to warp, is separated into an inner peripheral portion 14 and an outer peripheral portion 15, and the inner portion 14 and the outer peripheral portion 15 are sealed and connected together by a flexible material 17. The seal rubber 6 is attached to the outer peripheral portion 15 and may seal the clearance between the outer peripheral portion and the underside of the mask supporting member 3. Since the wafer supporting member is so constructed, the atmospheric pressure exerted on the outer peripheral portion 15 is exerted on the mask supporting member when air vent is effected by a vacuum pump through the exhaust hole 7. Accordingly, the load exerted on the underside of the mask 1 is determined by the size of the inner peripheral portion 14 expressed by a diameter D. Thus, by suitably determining the size of the inner peripheral portion 14, the load exerted on the underside of the mask 1 can be made smaller than the load exerted on the top surface thereof. When such size is determined, various factors such as the weight of the wafer supporting member 4 and the elasticity of connecting rubber 17 must be taken into account.

Figure 6:
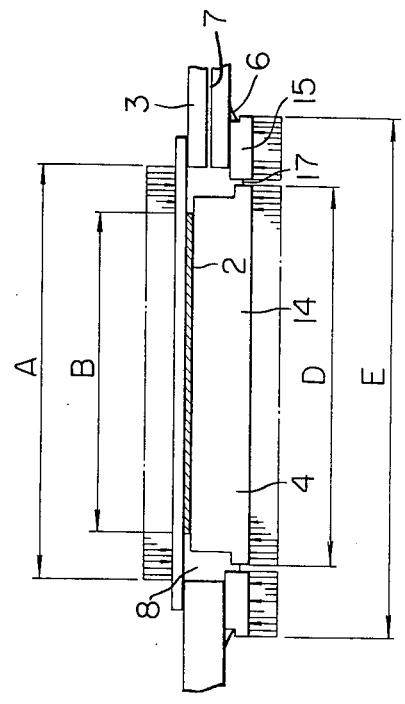
FIGS. 5 and 6 show a second embodiment of the present invention.
Figure 5:
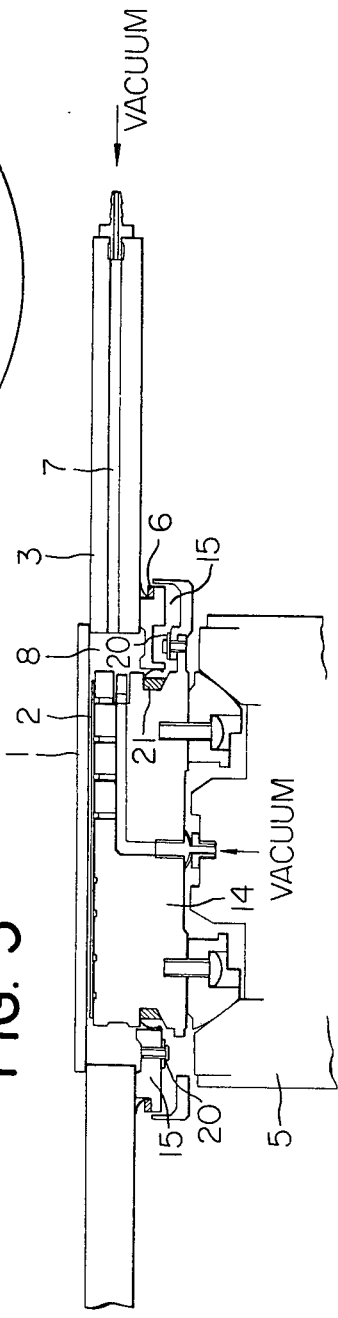

FIGS. 5 and 6 show a second embodiment of the present invention. In this embodiment, the outer peripheral portion 15 is connected to the inner peripheral portion 14 by means of a plate spring 20 (FIG. 6). Accordingly, the inner peripheral portion 14 can be independently moved vertically relative to the outer peripheral portion 15, but parallel movement thereof takes place with the outer peripheral portion. Denoted by 21 is seal rubber for maintaining the air tightness of a space 8 even if the inner peripheral portion 14 is moved vertically. Again in this embodiment, the load exerted on the underside of the mask 1 is reduced by making the size of the inner peripheral portion smaller than the opening of the mask supporting member.

What we claim is:

1. An alignment device wherein a relatively flexible mask and a wafer are brought into intimate contact with each other for the manufacture of a semiconductor circuit element, comprising:
    a mask supporting member for supporting the mask, said mask supporting member being provided with an opening which is covered by the mask when the mask is placed for support by the mask supporting member;
    a wafer supporting member, of a non-flexible material, for supporting the wafer in opposition to the bottom surface of the mask, said wafer having an area less than that of said opening of said mask supporting member;
    a seal member for rendering air-tight the clearance between said mask supporting member and said wafer supporting member;
    a vacuum pump for evacuating the clearance between said mask support member and said wafer supporting member and for bringing the mask into intimate contact with the wafer;
    a wafer side pressure receiving surface of a predetermined effective area for receiving a load distribution corresponding to the differential between the vacuum pressure and the atmospheric pressure when said vacuum pump is operated; and
    a mask side pressure receiving surface of a predetermined effective area for receiving a load distribution corresponding to the differential between the vacuum pressure and the atmospheric pressure when the mask is brought into intimate contact with the wafer by the operation of said vacuum pump, said effective area of said mask side pressure receiving surface being enough to prevent the central portion of the mask from warping away from the wafer.

2. An alignment device wherein a relatively flexible mask and a wafer are brought into intimate contact with each other for the manufacture of a semiconductor circuit element, comprising:
    a mask supporting member for supporting the mask, said mask supporting member being provided with an opening which is covered by the mask when the mask is placed for support by the mask supporting member;
    a wafer supporting member, of a non-flexible material, for supporting the wafer in opposition to the bottom surface of the mask, said wafer having an area less than that of said opening of said mask supporting member, said wafer supporting member including a wafer supporting portion having an area which can be insertable into said opening of said mask supporting member to allow the contact between the mask and wafer;
    a member opposed to the bottom surface of said mask supporting member outside said opening, said opposed member being movable relative to said wafer supporting member, when it abuts the bottom surface of said mask supporting member;
    a seal member for rendering air-tight the clearance between said mask supporting member and said wafer supporting member; and
    a vacuum pump for evacuating the clearance between said mask supporting member and said wafer supporting member and for bringing the mask into intimate contact with the wafer.

* * * * *